United States Patent [19]
Schumann

[11] 3,811,125
[45] May 14, 1974

[54] ANALOG-TO-DIGITAL CONVERTER

[75] Inventor: Robert W. Schumann, Madison, Wis.

[73] Assignee: Nicolet Instruments, Inc., Madison, Wis.

[22] Filed: May 8, 1972

[21] Appl. No.: 251,343

[52] U.S. Cl. .................... 340/347 AD, 340/347 CC
[51] Int. Cl. .......................................... H03k 13/02
[58] Field of Search ................ 340/347 AD, 347 CC

[56] References Cited

UNITED STATES PATENTS

| | | | |
|---|---|---|---|
| 3,739,375 | 6/1973 | Chatelon et al. | 340/347 AD |
| 3,419,819 | 12/1968 | Murakami | 340/347 CC |
| 3,105,230 | 9/1963 | MacIntyre | 340/347 CC |
| 3,059,223 | 10/1962 | Bell | 340/347 AD |

*Primary Examiner*—Thomas A. Robinson
*Attorney, Agent, or Firm*—Lew Schwartz

[57] ABSTRACT

An analog-to-digital converter of the successive approximations type, having a summing node for receiving the input signal and a series of trial currents, and having means for comparing the two. Further means are connected to the summing node for maintaining it at a fixed voltage for an interval preceding a comparison of a trial current with the signal input current. In the preferred embodiment, the further means includes a passive clamp connected to the node, and means for providing a clamp current to the node. Temperature compensation means may also be provided.

20 Claims, 5 Drawing Figures

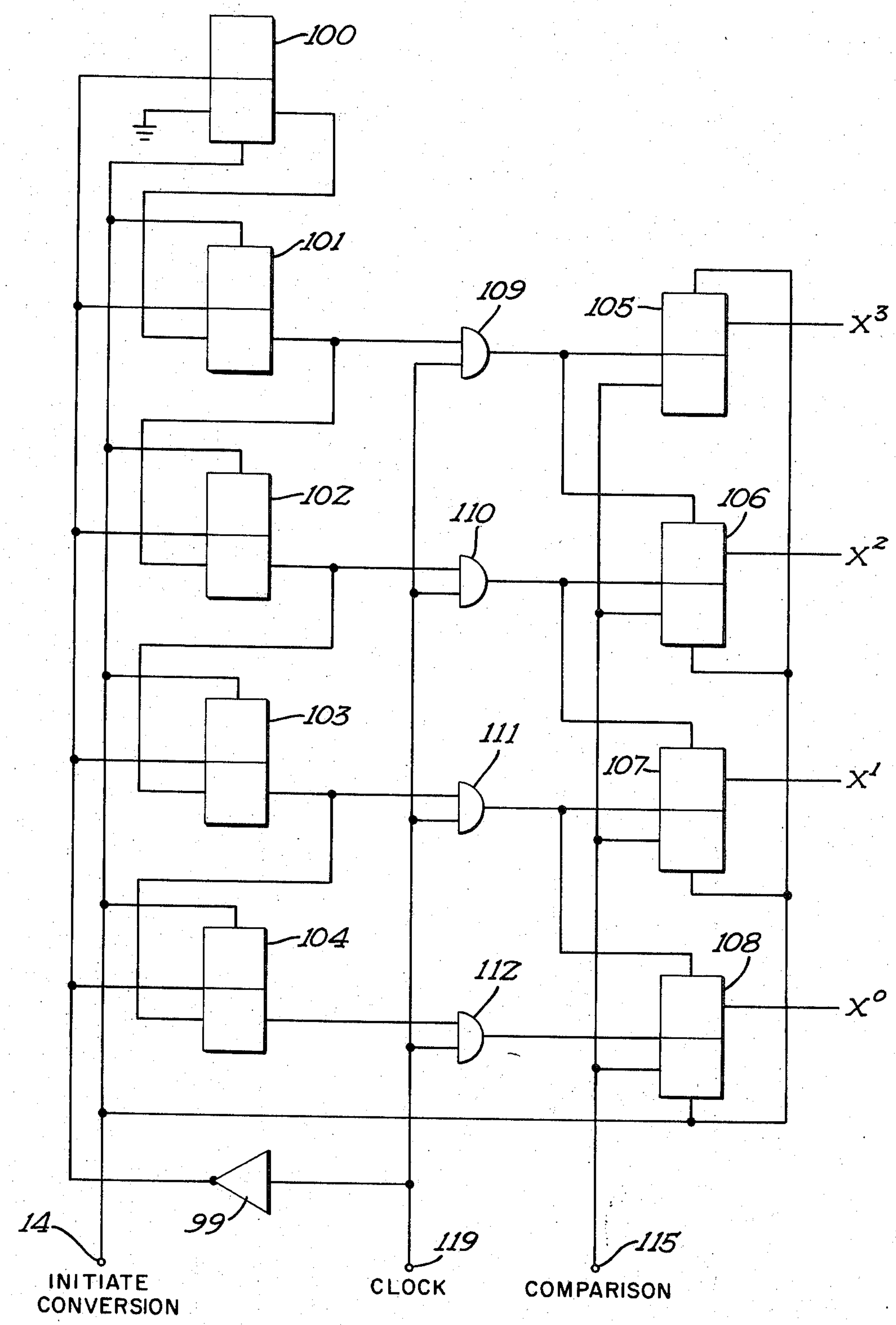
FIG 4 DIGITAL LOGIC CIRCUITS, TYPICAL

ANALOG-TO-DIGITAL CONVERTER

BACKGROUND OF THE INVENTION

This invention is concerned with analog-to-digital converters. Such instruments are well-known in the art, and it is also well-known that a continuing limitation of such instruments is the speed at which the instrument can convert. The apparatus of this invention provides unique means for increasing the speed of conversion. The improvement is provided at relatively low cost with high reliability.

In analog-to-digital converters, a well-known method of conversion is the successive approximations method. The general operation of this method is well-known to those of reasonable skill in the art. In this method, a series of electrical quantity voltages or currents are generated on a trial basis, typically by a digital-to-analog converter, and are presented to a summing node for comparison with the signal voltage. Depending on whether the trial voltage is higher or lower than that of the signal, a higher or lower new trial value is generated and again compared with the input signal. This process continues until the trial voltage compares favorably with the input voltage at which time the comparison is sensed and the process is halted. The digital number representing the favorably compared trial voltage is then available from the digital-to-analog converter as a readout for the instrument. The digital-to-analog converter produces the trial voltages or currents in response to trial numbers generated by digital logic circuitry which receives information from the comparison means and is operated by a timing means.

As stated above, the element of speed is of continuing importance in analog-to-digital converters. In such instruments of the successive approximations type, the speed is limited by three factors: (1) the time required to produce a new trial number following a previous comparison; (2) the time required to produce the trial voltage or current following presentation of the new trial number to the digital-to-analog converter; and (3) the time required for the comparison to be made accurately. The prior art logic circuitry is capable of high speeds, presently as fast as a few tens of nanoseconds. Prior art comparison circuits are at least this fast, also. However, the speed of the digital-to-analog converter is comparatively low and except by use of highly expensive circuits, requires in the order of hundreds of nanoseconds before its output is correct. This invention has the object of and performs the purpose of increasing the speed of generation of the trial voltages or currents.

The prior art devices have recognized that one of the problems involved in high speed conversion is the stray capacitance found at the summing node and the input to the comparison means. Some of the prior art circuitry has provided clamping devices at the node to attempt to decrease the effect of this stray capacitance on a changing trial voltage or current. Such clamping devices, though they may have added some speed to the instrument, have not been highly successful in obviating the problem of the stray capacitance to enable higher speed conversion for reasons described below. In the apparatus of this invention, higher speeds are achieved by use of a clamp means which enables the summing node to be maintained at a predetermined voltage for a period of time preceding the comparison of each trial signal with the input signal. In the preferred embodiment an additional current is provided to the summing node and to a passive clamping device attached to the summing node during the period of time preceding the comparison.

SUMMARY OF THE INVENTION

Briefly described, the apparatus of this invention comprises an analog-to-digital converter having a summing node connected to input means adapted to receive an input signal to be measured. Also connected to the summing node are means for providing a series of trial currents or voltages and means for comparing the trial signals to the input signal and providing information depending on the comparison result. A clamping means is also connected to the summing node and, in the preferred embodiment, includes a substantially passive clamping device such as a diode or a transistor junction and means for providing an additional current through the summing node prior to the time the comparison is made. Timing means are provided to control the operation of the clamping device and the comparison and trial signal producing devices. In another of the preferred embodiments described herein, temperature compensation means are provided.

BRIEF DESCRIPTION OF THE DRAWING

FIG. 4 is a schematic of a portion of logic circuitry used in the apparatus of this invention.

DESCRIPTION OF THE PREFERRED EMBODIMENT

To best understand the operation of the apparatus of this invention the speed problem involved in prior art analog-to-digital converters will first be described. The designs of such prior art instruments will vary, but the problems related to speed are similar. The prior art configuration of FIG. 1 will be described, and has been chosen because it is somewhat similar to the apparatus of this invention.

Figure 1:
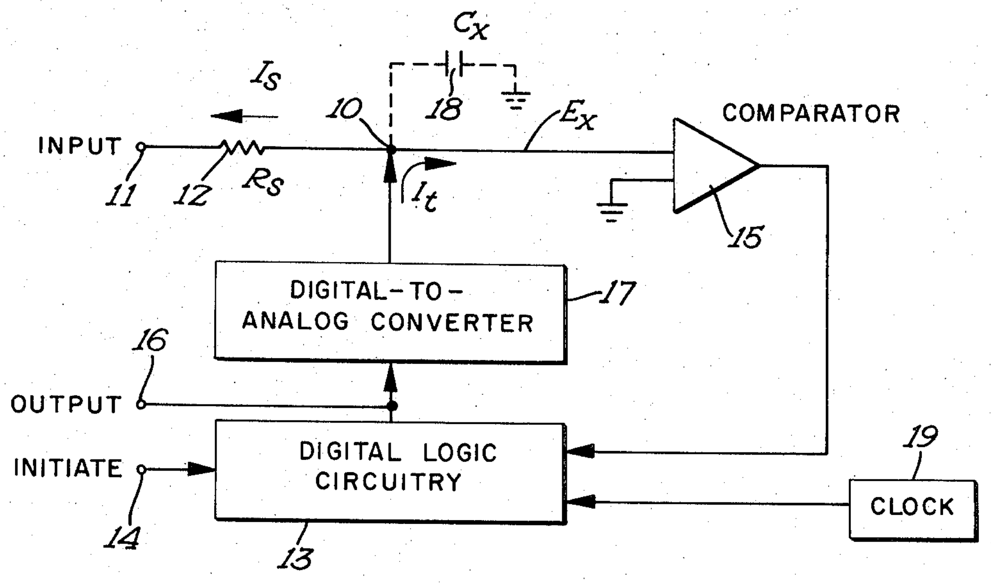
FIG 1 PRIOR ART
FIG. 1 is a schematic of a prior art analog-to-digital converter of the successive approximations type.

In FIG. 1 there is shown an input terminal 11 connected through a resistor 12 to a node 10. Node 10 is also connected to the input of a comparator 15 which has its output connected to digital logic circuitry indicated as box 13. Circuitry 13 has an output connected to the input of a digital-to-analog converter 17, which in turn has an output connected to node 10. A clock 19 is connected to the input of digital logic circuitry 13. Circuitry 13 also has its output connected to a readout terminal 16 and has an input connected to an initiate conversion terminal 14. A stray capacitance effect exists at node 10 and has been shown in FIG. 1 as a capacitor 18 connected through dotted lines to node 10. In FIG. 1, the current produced by the input signal has been denoted by an arrow labeled $I_s$. Resistor 12 has a resistance denoted as $R_s$. The trial current produced by converter 17 has been denoted with an arrow labeled $I_t$. The stray capacitance 18 has been denoted as $C_x$, and the voltage at node 10 has been denoted as $E_x$.

The prior art design shown in FIG. 1 is well-known by those skilled in the art. The operation is such that when an input signal appears at terminal 11 and an initiate conversion signal is provided at terminal 14, logic circuitry 13 will provide a digital number to converter 17 which will in turn provide a trial current to node 10. This trial current $I_t$ is compared with the signal current $I_s$ by comparator 15. The output of comparator 15 will tell digital logic circuitry 13 to provide either a higher or lower trial current, or that the comparison was successful and that further trials are not necessary and the digital numbers should be read out at output terminal 16. Clock 19 provides the timing for the presentation of new digital trial numbers from circuitry 13 to converter 17.

As is known the first trial number used is one-half of the maximum number. For an N bit analog-to-digital converter the number is 1000...00, using the 1's complement representation. If the trial current is greater than the signal current, the next trial number will be 1100...00, and if the trial current is less than the signal current the next trial number will be 0100...00. The algorithm is that following the $n$th trial, the $(n + 1)$th bit from the left is made a "1," and the $n$th bit from the left remains as a "1" if the trial showed the signal current was higher than the trial current, otherwise it is made a "0." Only the $n$th and the $(n + 1)$th bits are altered following the $n$th trial. Higher order bits remain as set following earlier trials.

The time required for the digital-to-analog converter 17 to produce the correct current, a current accurately proportional to the trial number magnitude, is a function of the accuracy needed in the final results. If it is demanded that a voltage be measured with 12-bit accuracy, then the output of converter 17 must have settled to within one part in 4,096 of its final value during each comparison, not just the last comparison. It will be recognized that even this is an inadequate accuracy demand, for other errors are involved. It is a practical and reasonable requirement that transient errors in the output of converter 17 be less than 0.01 percent for this case.

In the circuit of FIG. 1, the voltage at node 10 may be several volts positive or negative at the moment that converter 17 receives a new digital trial number from circuitry 13. Converter 17 is a current producing device, and may be highly accurate in steady state. However, comparator 15 is a current sensitive device and another current exists besides the signal current and the trial current from converter 17. This other current is the charging current which is involved because of the stray capacitance at node 10, indicated as capacitor 18, and the voltage changes that result from changes in current from converter 17. The charging current of stray capacitor 18 is exponential, with a time constant $R_sC_x$.

For simplicity, in the discussion of the circuitry of FIGS. 1–5, it will be assumed that comparator 15 is voltage sensitive only, and that it has essentially infinite input resistance. It will also be assumed that when the voltage exceeds zero volts, the output of comparator 15 will be positive, otherwise negative. It will be recognized to those skilled in the art that the question of whether current comparator 15 is voltage or current sensitive is in a sense a philosophical one. Practical comparators include bipolar transistors or field-effect transistors or similar devices. The bipolar transistor is a current operated device, but the field-effect transistor is voltage sensitive. The bipolar transistor is, in a sense, also voltage sensitive because its base current will vary drastically with base voltage changes. For both devices the voltage must be at a certain level for proper operation, and therefore the above assumption has been made that the comparator is only voltage sensitive.

In FIG. 1, the voltage $E_x$ at node 10 will be equal to the signal voltage, $E_s$, minus $I_tR_s$, in the steady state. Assume, for purposes of explanation, that $E_s$ has the range 0–10 volts, $R_s = 1{,}000$ ohms, and $I_t$ has the range 0–10 milliamperes. These are reasonable value assumptions. Also assume a case one, in which the trial current $I_t$ is 5.00 milliamperes and the input voltage $E_s$ is 7.501 volts; $E_x$ will be about plus 2.5 volts at the moment logic circuitry 13 is clocked (that is, the moment the decision will be made by the logic circuits to revise the trial number upwards or downwards). Assume also a case two, in which $E_s$ is 2.501 volts, and in which $E_x$ will be about minus 2.5 volts at the moment circuitry 13 is clocked.

When the currents from converter 17 change, the new trial current values will be 7.5 milliamperes or 2.5 milliamperes, in the respective of the two cases, according to the previously stated factors. In both case one and case two, the next trial should produce a positive output from comparator 15. Inasmuch as $E_x$ in case one will be undergoing a transition from about plus 2.5 volts towards a steady state value of 0.001 volts, there is no doubt that the output of comparator 15 will be positive. For case two, however, the voltage transition of $E_x$ will be from about minus 2.5 volts to a steady state value of plus 0.001 volts. $C_x$ may have a value of approximately 20pf, so $R_sC_x$ will equal 20 nanoseconds. A time equal to about nine time constants must have elapsed before $E_x$ will have become positive, therefore no clocking of logic circuitry 13 will be allowable in the apparatus of FIG. 1 until at least 180 nanoseconds following each trial current change. The time problem is worse if $E_s = 2.5001$ volts, as about two more time constants are needed.

As stated previously, it is recognized by those skilled in the art that this time problem exists, and one way to reduce it is known to be by use of voltage clamps at node 10, to prevent such wide excursions of voltage when trial currents are in substantial error. However, unless the clamping voltages are within an exceedingly narrow range there is little benefit from the clamp. Clamping to within 100 millivolts for the case where accuracy of 0.01 percent is needed reduces the time of settling by only a small amount, because the approach to the final $E_x$ value is exponential. Such a narrow clamp range is not easy to achieve. It is not practical to reduce $R_s$ to much smaller values, to reduce $R_sC_x$ values, because then the range of voltages, $E_x$, at node 10 becomes too small. An accuracy of 0.01 percent, even with $R_s$ as large as 1,000 ohms means that the smallest voltage of interest will be $5 \times 10^{-4}$ volts and so circuit noise due to electrical transients becomes an important effect, and the voltage comparator design becomes difficult because so much amplification is needed.

Making $R_s$ larger makes clamping more practical because a change of 0.01 percent in signal produces large changes in voltage at node 10. In the extreme, if $R_s$ is infinite, and if clamping is used, the transition from one clamping voltage to a voltage zero is accomplished in a time, $t_d = E_c C_x / q_s$, where $q_s = I_s - I_t$. For a range of 0–10 milliamperes for signal and trial currents, an error of 0.01 percent corresponds to a $q_s$ value of 1 microampere and for a 0.5 volt clamp voltage $E_c$, $t_d$ = 10 microsecond, which is not an improvement.

In the apparatus of this invention, the performance of the circuitry with respect to speed is improved by use of a passive clamp and of a third current, $I_c$, applied to node 10 briefly during the interval in which the trial currents from converter 17 are changing to a new value. This new current may be applied for a few tens of nanoseconds, and its value is sufficient to insure that $I_s - (I_t + I_c)$ is always positive sufficient to reach a predetermined clamping voltage. When the clamp current $I_c$ is removed, the voltage transition to or below the comparator threshold voltage is independent of the value which $E_x$ had during the previous trial.

The removal of the effect of $E_x$ during the previous trial is highly significant, because it is unnecessary to wait until the minimum error current of interest, $q_s$, causes the transition of $E_x$ to zero. If the waiting time is reduced to 100 nanoseconds, the threshold will be crossed only if there is a current difference between $I_s$ and $I_t$ of 100 microamperes, which is far in excess of the allowable error. However, the most important consideration is that this is a fixed error, and causes all values to be generated by a fixed amount too low, something easily corrected by adding a fixed amount to either the signal or trial currents.

In the apparatus of this invention the predetermined voltage to which node 10 is clamped may be made nearer to zero, if desired, and the capacity $C_x$ can be reduced to some extent, with the result that the offset error is reduced and the waiting time further reduced.

Referring now to the apparatus of this invention as shown in FIG. 2, there is again shown an input terminal 11 connected through a resistor 12 to a node 10. Node 10 is connected to the input of a comparator 15, the circuitry of which is enclosed within dotted lines. The output of comparator 15 is connected to digital logic circuitry 13 which in turn has an output connected to output terminal 16 and digital-to-analog converter 17. The output of converter 17 is again connected to node 10. Initiate conversion terminal 14 is again connected to the input of circuitry 13. A clamp current circuit 30 is provided, the circuitry of which is shown within dotted lines. The output of clamp current circuit 30 is connected to node 10. Clock 19 is connected through a delay circuit 20 to the input of circuitry 13 and is connected to the input of clamp current circuit 30 and a portion of comparator 15. Clock 19 provides a timing signal having a first portion 21 as shown, and a second portion 29 as shown.

Comparator 15 comprises a transistor 23 having its base connected to node 10, its emitter connected to ground and its collector connected through a resistor 24 to a terminal 28 adapted to be connected to a positive source of energy. Transistor 23 serves as a voltage discriminator and is preferably a high beta transistor. Comparator 15 also includes another transistor 25 having its base connected to the collector of transistor 23, its emitter connected to ground, and its collector connected through a resistor 26 to terminal 28. The collector of transistor 25 is connected to the D input terminal of a D-type latch 27, well-known to those skilled in the art. The reset terminal of latch 27 is connected to clock

19, and the output of latch 27 is connected to the input of logic circuitry 13.

Clamp current circuit 30 is shown to comprise a pair of diodes 31 and 32 each having an anode connected through a resistor 33 to a terminal 34 adapted to be connected to a positive source of energy. The cathode of diode 31 is connected to clock 19, and the cathode of diode 32 is connected to node 10.

Figure 2:
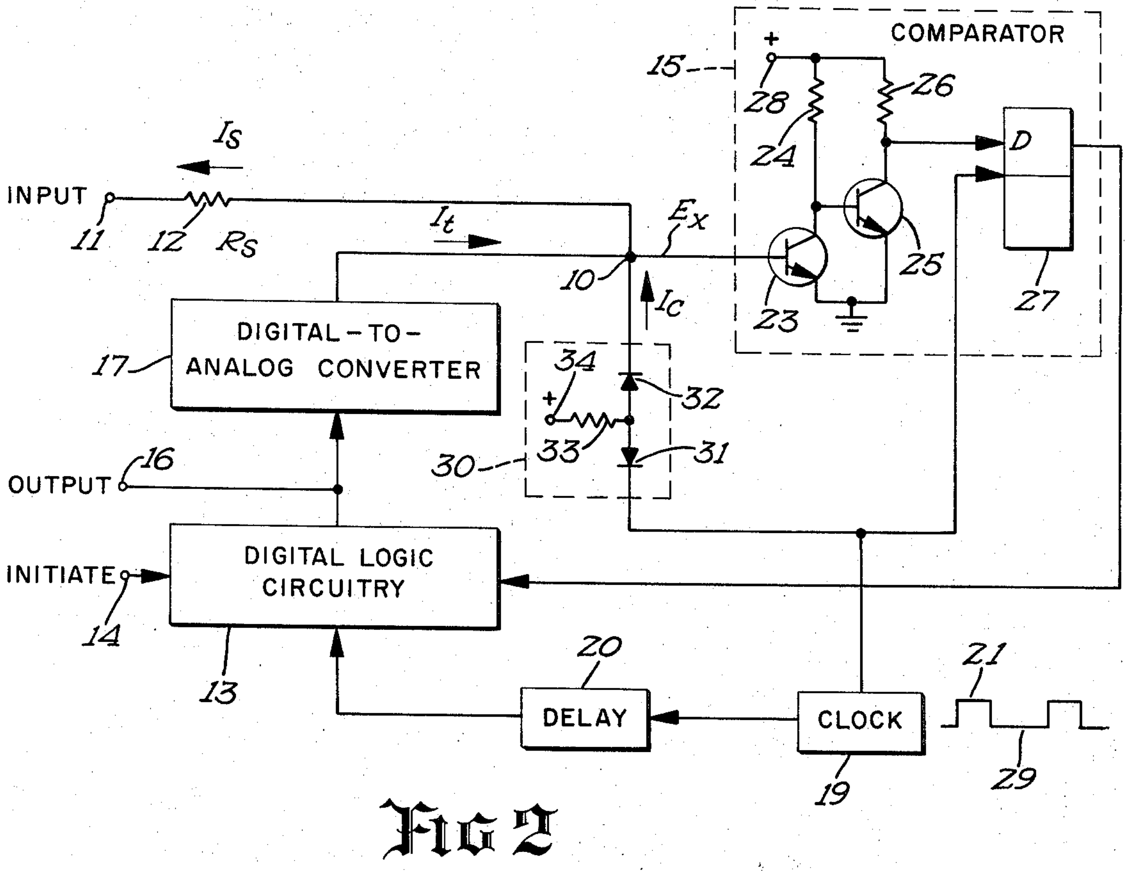
FIG. 2 is a schematic of an embodiment of the apparatus of this invention.

In operation of the apparatus of FIG. 2, when the voltage $E_x$ is more positive than the threshold level of the voltage discriminator comprising transistor 23, the output of latch 27 will be positive following the positive transition of the clock voltage, that is, when the clock wave form has entered time period 27. This positive output from latch 27 is applied to circuitry 13, the operation of which will be described below in the discussion of FIG. 4. A short time following the positive transition of the voltage from clock 19, thus entering time period 27, the output of latch 27, which comprises the comparison result, will cause digital logic circuitry 13 to produce a new trial number. The delay of circuit 20 is sufficient to allow circuitry 13 to respond to the comparison result from latch 27 before circuitry 13 is clocked to produce a new trial number.

When the voltage from clock 19, during period 21, is applied to diode 31, diode 32 will be biased on to allow a current flow through resistor 33 into node 10, for the period represented by 21 on the wave form of clock 19. This current will be inhibited during period 29 of the wave form of clock 19. The clamp current provided is not critical and any number of values may be used. For purposes of this explanation it will be assumed that $I_c$ is equal to more than one-half of the maximum signal current, $I_s$. The effect of the clamp current, $I_c$, is to cause voltage $E_x$ at node 10 to become positive (it being recognized that though not shown, the stray capacitance $C_x$ is still present at node 10), but $E_x$ will not rise above the clamping voltage effect of the base junction of transistor 23. It is reasonable to assume that this voltage may be about 0.7 volts.

When $I_c$ is removed during period 29 of clock voltage 19, the voltage $E_x$ of node 10 will become less positive, and if $I_t$ is less than $I_s$, $E_x$ will drop toward a more negative value, and will be lower than the threshold level of transistor 23 by the time of the next positive clock voltage transition. The amount by which $I_s$ must exceed $I_t$ for the threshold of voltage discriminator 23 to be crossed is a function only of the stray capacitance of node 10, the base current of transistor 23, the difference between the clamping voltage of the base of transistor 23 and the threshold voltage, the duration of period 29 of the clock voltage, and the amount of charge needed to remove the excess charge carriers within transistor 23. All of these are substantially constant functions, and variations in these functions will effect only the intercept with zero of the voltage versus final number value characteristics of the analog-to-digital converter. They do not affect the slope nor linearity of that characteristic.

Figure 5:
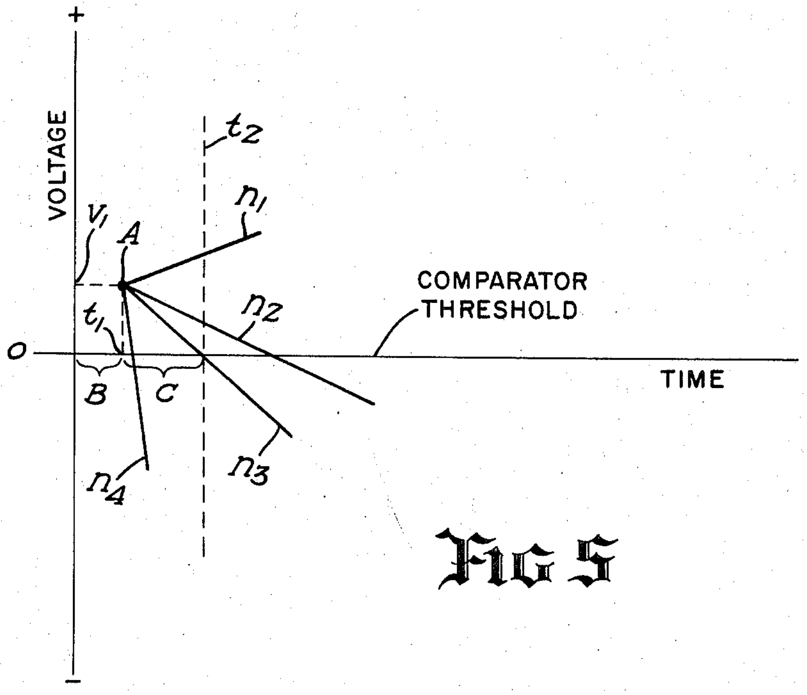
FIG. 5 is a graphic representation of a portion of the operation of the apparatus of this invention.

Thus it can be seen that the apparatus of this invention, as shown in the circuit of FIG. 2, removes the effect of the value of $E_x$ in the previous trial for the trial presently under comparison. In other words, the dilatory effect of the charge time of the stray capacitance at node 10 is essentially overcome by providing a positive clamp which returns node 10 to a predetermined voltage preceding each comparison. By so doing, the apparatus of this invention enables accurate conversion at significantly higher speeds. Reference can be made to the graph of FIG. 5 to further understand the beneficial effects of the apparatus of this invention. The ordinate of the graph of FIG. 5 represents voltage from a plus value to a minus value. The abscissa represents time, and the comparator threshold level is shown as zero, in keeping with the assumptions stated above. Point A represents the predetermined voltage to which node 10 has been clamped by the use of clamp current circuitry 30 providing $I_c$ to node 10 and the clamp device shown in FIG. 2 as the base junction of transistor 23. Thus, during the interval B preceding each trial comparison, the voltage of node 10 will be raised such that at time $t_1$ the voltage value will be at $V_1$ represented by point A. Interval C on the graph represents the comparison period and the line $t_2$ represents the time at which comparison results are provided. Thus it can be seen, that for each comparison cycle, the slope of the value representing the combination of the signal current $I_s$ and the trial current $I_t$ will commence at point A. Depending on the relative signal and trial currents, the slope of the characteristics from point A may be positive or negative. For example, $n_1$ indicates a positive slope which will never cross zero voltage and $n_4$ represents a negative slope which is so steep as to cross the comparator threshold level early and be of a negative value at the time the comparison result is given. Slope $n_2$ represents a negative slope which does not cross the threshold level until after the comparison is completed and will thus show a positive value at the time the comparison result is given. Finally, slope $n_3$ indicates an accurate comparison between $I_s$ and $I_t$, indicating that the signal should be given to the logic circuitry 13 to end further comparisons.

In reference to FIG. 5, it will be apparent that should point A have been either more positive or more negative for each commencement of a comparison period, the desired slope $n_3$ could not have crossed the comparator threshold at the desired time. It is this error which exists in prior art devices which require that a greater time be used to eliminate the effects of $E_x$, and thus reduce the speed of measurement. In the apparatus of this invention the voltage level of point A is substantially the same at the beginning of each comparison period, and the length of time of the comparison period C is limited only by the substantially constant functions described above which effect the intercept with zero of the voltage versus final number value characteristic of the analog-to-digital converter.

The apparatus of FIG. 2 is the preferred embodiment of this invention, particularly in view of its simplicity, however, it will be recognized that other forms of voltage comparators may be used, as long as a clamping device is included to prevent voltage $E_x$ at node 10 from rising high above the discriminator threshold voltage. Other comparators may be readily suggested which involve no current sinking, for example, using a field-effect transistor rather than an NPN junction transistor for transistor 23. The use of such a field-effect transistor, for example, would require that an external clamp be provided at node 10. Such a clamp could take any one of a number of forms, such as a fast recovery diode, connected anode to node 10, cathode to ground.

Figure 3:
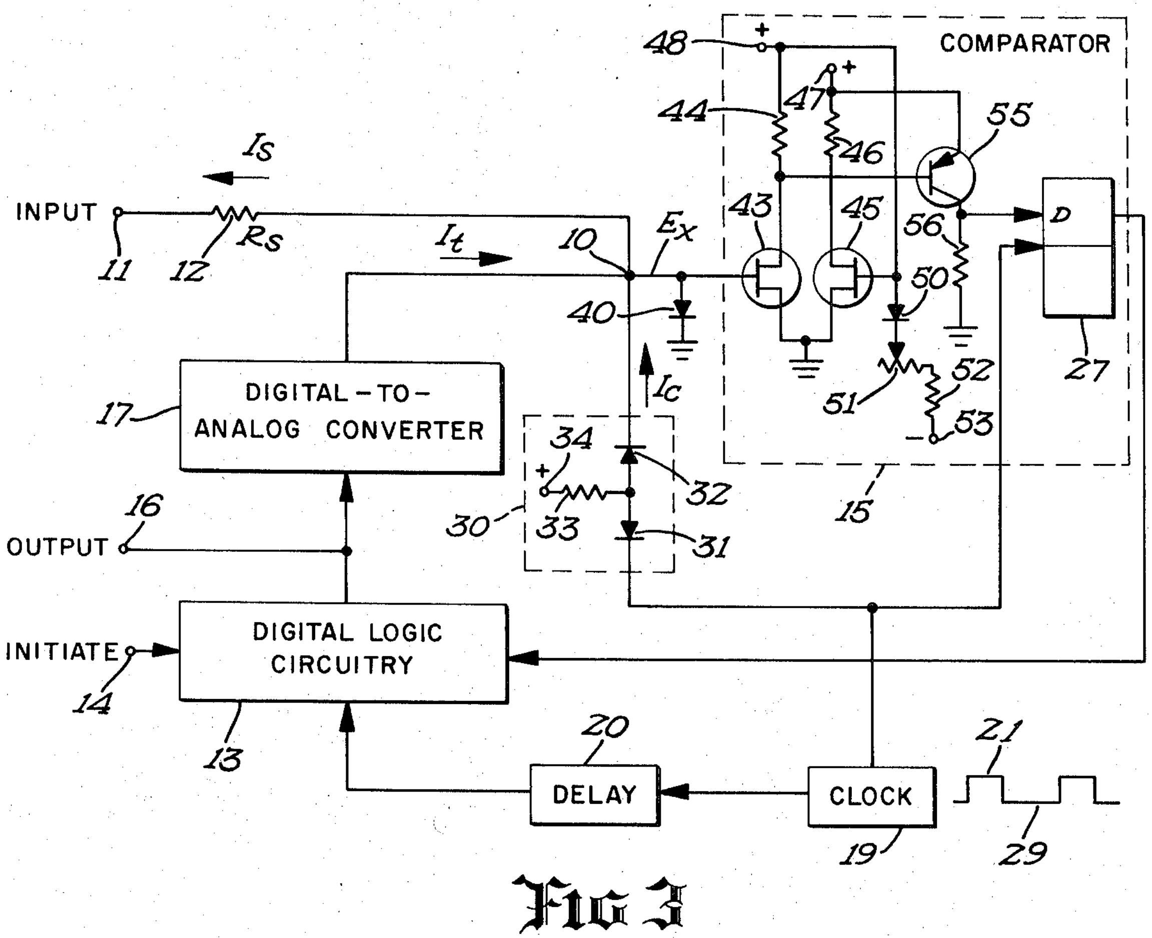
FIG. 3 is a schematic of a second embodiment of the apparatus of this invention.

The apparatus of FIG. 3 is an example of another preferred embodiment of this invention for use when it is desired to minimize the effects of temperature changes.

In the apparatus of FIG. 3, the circuitry is the same as that in FIG. 2 with the exception that a clamping diode 40 has its anode connected to node 10 and its cathode connected to ground, and with the exception of a change of a portion of the circuitry within the dotted lines of comparator 15. In FIG. 3, comparator 15 comprises a pair of field-effect transistors 43 and 45, as well as a PNP transistor 55. The gate of transistor 43 is connected to node 10. One of the bases of each of transistors 43 and 45 are connected to ground. The other base of transistor 43 is connected through a resistor 44 to a terminal 48 adapted to be connected to a positive source of energy, and to the base of transistor 55. The other base of transistor 45 is connected through a resistor 46 to a terminal 47 also adapted to be connected to a positive source of energy. The gate of transistor 45 is conencted to terminal 48 and to the anode of another diode 50. The cathode of diode 50 is connected to the wiper arm of a variable resistor 51 which is in turn connected through a resister 52 to a terminal 53 adapted to be connected to a negative source of energy. The emitter of transistor 55 is connected to terminal 47, and the collector of transistor 55 is connected through a resistor 56 to ground, and to the D input of latch 27.

In the embodiment of FIG. 3, when the voltage of the gate of transistor 43 exceeds that of the gate of transistor 45, the output on the collector of transistor 55 will be positive. Clamp diode 40 has a clamp voltage level which is temperature sensitive, however, diode 50 is selected to have essentially the same temperature characteristic. The threshold level of comparator 15 therefore rises or falls with the rise or fall of the clamping level of diode 40. Resistors 51 and 52 are included to enable a setting such that the threshold voltage will be lower than the clamp voltage of diode 40.

The use of the more elaborate comparison circuitry of FIG. 3 will substantially eliminate the hole storage effect of the embodiment shown in FIG. 2. It will also eliminate the effects of base current in transistor 23 of the apparatus of FIG. 2, and it will provide for a lower voltage difference between clamp and discriminator threshold voltages so that the offset of the signal current versus number value characteristic is both lower and more consistent with temperature changes than the embodiment of FIG. 2.

In FIG. 4 there is shown digital logic circuitry of a typical four bit analog-to-digital converter, which is shown here to be representative of the logic circuits used in the embodiments of FIGS. 2 and 3. A plurality of flip-flops 100–104 are interconnected in a well-known prior art manner to comprise a shift register. Terminal 14, which receives the initiate conversion signal, is connected to each of the flip-flops 100–104 such that the shift register is set to 10000 by the initiate conversion pulse. A plurality of flip-flops 105–108 are connected in a standard manner to comprise a data register. Each of flip-flops 105–108 are connected to a terminal 115 which represents the connection to the output of comparator 15 in each of FIGS. 2 and 3. Also shown are a plurality of AND gates 109–112. Each of gates 109–112 has one input connected to a terminal 119 adapted to receive the clock signal, which in FIGS. 2 and 3 would represent the signal from clock 19 through delay circuitry 20. Gate 109 has another input connected to the output of flip-flop 101, and an output connected to the input of flip-flop 105. Gate 110 has another input connected to the output of flip-flop 102, and an output connected to the input of flip-flop 106. Gate 111 has another input connected to the output of flip-flop 103, and an output connected to the input of flip-flop 107. Gate 112 has another input connected to the output of flip-flop 104, and an output connected to the input of flip-flop 108. Terminal 119 is also connected through an inverter 99 to the inputs of each of flip-flops 100–104. Gates 109–112 are used to successively toggle the data register stages 105–108 at the time the clock pulse at terminal 119 becomes positive, and to set the next flip-flop to the "1" state.

At the time of the first clock pulse, none of gates 109–112 is enabled, but at the end of the positive clock pulse the shift register assumes state 01000 because the inverted clock pulse produced by inverter 99 produces at that time the required positive transition at the toggle inputs to flip-flops 100–104. This state of the shift register enables gate 109, so when the next clock pulse occurs flip-flop 105 is set to state "0" or "1" depending upon whether the comparison result signal at terminal 115 is high or low, respectively. Flip-flop 106 is turned on at the same time. This process continues until the four stages 105–108 have been conditionally set. The resulting digital numbers, represented in FIG. 4 by $X_0$–$X_3$, are presented to converter 17 in FIGS. 2 and 3.

The flip-flops 100–108 of FIG. 4 are D-type latches, well-known in the prior art, with the set and reset signals positive-active. It is apparent that more shift register and data register stages can be added to produce, for example, a 12 bit trial number generator.

From the above disclosure it is apparent that the apparatus of this invention provides a unique and valuable method of increasing the speed of measurement of successive approximation type analog-to-digital converters. The apparatus of this invention has been built and tested and found to be reliable in its operation. It will also be apparent that variations of this invention can be made other than those of the preferred embodiments shown, without departing from the spirit and scope of this invention.

What is claimed is:

1. In analog-to-digital converter apparatus including successive approximation apparatus comprising input means for receiving an input signal, node means connected to the input means for receiving signal current, means for providing trial currents connected to the node means, comparator means for comparing the signal and trial currents connected to the node means, and digital means connected to the comparator means for providing a digital signal dependent on the comparison of the signal and trial currents, the improvement comprising: means for clamping the node means at a predetermined voltage for an interval of time preceding each comparison of the signal and trial currents; and means connecting the clamp means to the node means.

2. The apparatus of claim 1 in which the clamping means includes: means for providing a temporary clamp current to the node means, the temporary clamp current means connected to the node means.

3. The apparatus of claim 2 in which the clamping means includes: passive clamp means connected to the node means.

4. The apparatus of claim 3 in which the passive clamp means comprises a diode.

5. The apparatus of claim 3 in which the passive clamp means comprises a transistor junction.

6. The apparatus of claim 1 including: temperature compensation means connected to the comparator means; the compensation means including means for adjusting the comparator means threshold voltage level by an amount generally equal to the change in the clamp voltage caused by temperature changes.

7. Analog-to-digital converter apparatus comprising: input means for receiving input signals for conversion; summing node means connected to the input means; trial signal means for providing a succession of trial signals for comparison with each input signal; means connecting the trial signal means to the node means; comparison means connected to the node means for comparing the trial signals to the input signal and for providing a signal dependent on the comparison; digital means connected to the comparison means for providing a digital output in response to the comparison signal; clamp means connected to the node means; clamp current means connected to the node means for providing a current to the node means during a predetermined time preceding comparison of each trial signal to the input signal; and timing means connected to the trial signal means, the comparison means and the clamp current means.

8. Successive approximation analog-to-digital converter apparatus comprising: a summing node; input means; trial current means; clamp means; clamp current means; comparator means; means connecting all said means to the node; digital output means connected to the comparator means; clock means for providing at least first and second signals; and means connecting the clock means to the clamp current means and the trial current means for enabling the clamp current means iwth the first signal and enabling the trial current means with the second signal.

9. The apparatus of claim 8 in which: the comparator means includes transistor means; and the clamp means includes a base junction of the transistor means.

10. The apparatus of claim 8 in which: the clamp means comprises diode means connected to the node.

11. The apparatus of claim 10 in which: the comparator means includes further diode means; and the diode means and the further diode means having substantially equal temperature response characteristics.

12. An analog-to-digital converter comprising: signal input means; node means connected to the input means; digital-to-analog converter means having input means and output means; means connecting the digital-to-analog converter means output means to the node means for providing a sequence of trial currents to the node means; control means having input means and output means; means connecting the control means output means to the digital-to-analog converter means input means for controlling the sequence of trial currents; comparator means having input means and output means; means connecting the comparator means input means to the node means; means connecting the comparator means output means to the control means; voltage clamp means connected to the node means; clamp current means having input means and output means; means connecting the clamp current means output means to the voltage clamp means; timing means; and means connecting the timing means to the control means input means, the comparator means input means and the clamp current input means.

13. The converter of claim 12 in which the comparator means comprises: at least a first transistor means having base, collector and emitter electrodes, the base electrode connected to the node means and the collector and emitter electrodes adapted to be connected across a source of energy.

14. The converter of claim 13 in which the voltage clamp means comprises a base electrode junction of the first transistor means.

15. The converter of claim 13 in which the voltage clamp means comprises diode means.

16. The converter of claim 12 in which the timing means includes: means for cyclically actuating the clamp current means during a first predetermined period of time; means for cyclically actuating the control means during a second predetermined period of time; means for deactuating the clamp current means during the second period of time; and means for actuating the comparator means at the end of the second period of time.

17. The apparatus of claim 12 in which the comparator means comprises: at least first and second field-effect transistors each having a gate electrode and a pair of base electrodes; means connecting the first field-effect transistor gate electrode to the node means; each of the pair of base electrodes adapted to be connected across a source of energy; and means including first diode means adapted to connect the second field-effect gate electrode across a source of energy.

18. The apparatus of claim 17 in which the voltage clamp means comprises: second diode means having substantially equal temperature response characteristics to the first diode means.

19. The improved method of measuring an input signal to an analog-to-digital converter by successive approximation comprising the steps of: providing the input signal to a summing node; providing a series of trial currents to the summing node, each trial current for a predetermined period of time and each trial current related to a digital number; clamping the summing node to a predetermined voltage between each of the predetermined periods of time; and sensing the voltage level of the summing node at the end of each predetermined period of time.

20. The improved method of measuring an input signal to an analog-to-digital converter by successive approximation comprising the steps of: providing the input signal to a summing node; providing a series of trial currents to the summing node, each trial current for a predetermined period of time and each trial current related to a digital number; providing a clamping current to the summing node for a second period of time between each of the predetermined periods of time for setting the voltage level of the summing node to a predetermined value preceding each predetermined period of time; and sensing the voltage level of the summing node at the end of each predetermined period of time.

* * * * *